United States Patent
Park et al.

(10) Patent No.: US 11,150,838 B2
(45) Date of Patent: Oct. 19, 2021

(54) MEMORY SYSTEM AND METHOD OF OPERATING THE MEMORY SYSTEM

(71) Applicant: SK hynix Inc., Gyeonggi-do (KR)

(72) Inventors: Chang Kyun Park, Gyeonggi-do (KR); Young Sik Koh, Gyeonggi-do (KR); Seung Jin Park, Gyeonggi-do (KR); Dong Hyun Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 38 days.

(21) Appl. No.: 16/679,601

(22) Filed: Nov. 11, 2019

(65) Prior Publication Data

US 2020/0348886 A1 Nov. 5, 2020

(30) Foreign Application Priority Data

Apr. 30, 2019 (KR) ........................ 10-2019-0050591

(51) Int. Cl.
*G06F 3/06* (2006.01)
*G06F 13/16* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC .... G06F 3/0659; G06F 3/0604; G06F 3/0679; G06F 9/301; G06F 13/1668; G11C 7/222
(Continued)

(56) References Cited

U.S. PATENT DOCUMENTS 6,738,880 B2   5/2004 Lai et al.
6,813,682 B2 * 11/2004 Bress .................... G06F 3/0622
                                                        711/112
(Continued)

FOREIGN PATENT DOCUMENTS

KR   10-2010-0099892   9/2010
KR   10-2014-0088730   7/2014
(Continued)

OTHER PUBLICATIONS

Kim,H.J. et al., 1GB/s 2Tb NAND Flash Multi-Chip Package with Frequency-Boosting Interface Chip, ISSCC 2015 Session 7.
(Continued)

*Primary Examiner* — Christopher B Shin
(74) *Attorney, Agent, or Firm* — IP&T Group LLP

(57) ABSTRACT

The present technology includes a memory system and a method of operating the memory system. The memory system includes a memory device including an interface circuit and a semiconductor memory, and a controller configured to generate a command set in response to a host command and output the command set to the memory device. The interface circuit is configured to: receive the command set, transmit the received command set to the semiconductor memory, when the received command set corresponds to the semiconductor memory, perform a blocking operation so that the received command set is not transmitted to the semiconductor memory, when the received command set corresponds to the interface circuit, and perform an on-die termination operation, a ZQ calibration operation, or a driving force control operation of the interface circuit in response to the received command set corresponding to the interface circuit.

17 Claims, 11 Drawing Sheets

(51) Int. Cl.
*G06F 9/30* (2018.01)
*G11C 7/22* (2006.01)
(52) U.S. Cl.
CPC ...... *G06F 9/30101* (2013.01); *G06F 13/1668* (2013.01); *G11C 7/222* (2013.01)
(58) Field of Classification Search
USPC ........................................................ 711/154
See application file for complete search history.

(56) References Cited

U.S. PATENT DOCUMENTS

| | | | |
|---|---|---|---|
| 7,339,838 B2 * | 3/2008 | LaBerge | G11C 7/1006 |
| | | | 365/189.03 |
| 7,500,075 B1 * | 3/2009 | Garrett, Jr. | G06F 3/061 |
| | | | 711/167 |
| 8,364,881 B2 | 1/2013 | Urabe | |
| 9,025,384 B2 | 5/2015 | Lee et al. | |
| 9,037,774 B2 * | 5/2015 | Solomon | G06F 13/00 |
| | | | 711/5 |
| 9,093,132 B2 | 7/2015 | Kim et al. | |
| 9,536,590 B1 * | 1/2017 | Zhu | G11C 7/10 |
| 10,002,652 B1 | 6/2018 | Seong et al. | |
| 10,073,643 B2 | 9/2018 | Jung et al. | |
| 10,229,743 B1 | 3/2019 | Han | |
| 10,430,361 B1 * | 10/2019 | Wiebe | G06F 3/0673 |
| 10,496,332 B2 | 12/2019 | Srivastave et al. | |
| 10,714,162 B2 | 7/2020 | Koh | |
| 10,747,463 B2 | 8/2020 | Kajigaya | |
| 2002/0040418 A1 * | 4/2002 | Bress | G06F 3/0653 |
| | | | 711/112 |
| 2002/0069381 A1 | 6/2002 | Jeong et al. | |
| 2004/0186953 A1 * | 9/2004 | Bress | G06F 21/80 |
| | | | 711/112 |
| 2004/0193834 A1 | 9/2004 | Emberling | |
| 2006/0053353 A1 | 3/2006 | Youn et al. | |
| 2007/0206400 A1 * | 9/2007 | Bress | G06F 3/0623 |
| | | | 365/94 |
| 2008/0030221 A1 * | 2/2008 | Lee | H04L 25/0278 |
| | | | 326/30 |
| 2008/0080226 A1 | 4/2008 | Mikolajick et al. | |
| 2008/0123217 A1 | 5/2008 | Ishii | |
| 2009/0016124 A1 * | 1/2009 | Kim | G11C 7/1009 |
| | | | 365/194 |
| 2009/0080374 A1 | 3/2009 | Lee et al. | |
| 2009/0249136 A1 | 10/2009 | Halstvedt et al. | |
| 2010/0008177 A1 | 1/2010 | Joo et al. | |
| 2010/0054059 A1 | 3/2010 | Yoon et al. | |
| 2010/0054073 A1 | 3/2010 | Park | |
| 2010/0161933 A1 | 6/2010 | Moon et al. | |
| 2011/0050295 A1 | 3/2011 | Kim et al. | |
| 2011/0218949 A1 | 9/2011 | Cho et al. | |
| 2011/0296068 A1 | 12/2011 | Fredenberg et al. | |
| 2011/0296124 A1 | 12/2011 | Fredenberg et al. | |
| 2012/0106278 A1 | 5/2012 | Na | |
| 2012/0272112 A1 | 10/2012 | Oh et al. | |
| 2013/0272073 A1 * | 10/2013 | Hendrickson | G11C 7/22 |
| | | | 365/189.05 |
| 2014/0181452 A1 | 6/2014 | Malladi et al. | |
| 2015/0170724 A1 * | 6/2015 | Shaeffer | G11C 11/4063 |
| | | | 365/191 |
| 2015/0214172 A1 | 7/2015 | Lin et al. | |
| 2016/0062690 A1 | 3/2016 | Shin et al. | |
| 2016/0180898 A1 | 6/2016 | Hwang et al. | |
| 2016/0180914 A1 | 6/2016 | Kong | |
| 2018/0004688 A1 | 1/2018 | Chung et al. | |
| 2018/0233184 A1 | 8/2018 | Choi | |
| 2018/0373313 A1 | 12/2018 | Hasbun | |
| 2019/0004984 A1 | 1/2019 | Lee et al. | |
| 2019/0034365 A1 | 1/2019 | Lovelace et al. | |
| 2019/0038151 A1 | 2/2019 | Lee et al. | |
| 2019/0042120 A1 | 2/2019 | Kajigaya | |
| 2019/0079699 A1 | 3/2019 | Lee et al. | |
| 2019/0095223 A1 | 3/2019 | Dubel et al. | |
| 2019/0130950 A1 | 5/2019 | Kim et al. | |
| 2019/0156247 A1 | 5/2019 | Faulhaber, Jr. et al. | |
| 2019/0212769 A1 | 7/2019 | Carlough et al. | |
| 2019/0280600 A1 | 9/2019 | Rowley | |
| 2019/0295658 A1 | 9/2019 | Amaki et al. | |
| 2019/0296723 A1 | 9/2019 | Tang et al. | |
| 2019/0303310 A1 * | 10/2019 | Richter | G06F 3/061 |
| 2019/0310784 A1 | 10/2019 | Kim et al. | |
| 2019/0317683 A1 | 10/2019 | Mayer et al. | |
| 2019/0318555 A1 | 10/2019 | Hansel et al. | |
| 2019/0339881 A1 | 11/2019 | Scott, III | |
| 2019/0348095 A1 | 11/2019 | Koh | |
| 2019/0355435 A1 | 11/2019 | Liikanen et al. | |
| 2019/0362763 A1 * | 11/2019 | Lee | G11C 7/1048 |
| 2019/0392891 A1 | 12/2019 | Hong | |
| 2020/0133505 A1 | 4/2020 | Kim | |
| 2020/0133540 A1 | 4/2020 | Pilolli et al. | |
| 2020/0133542 A1 | 4/2020 | Kim et al. | |
| 2020/0160902 A1 | 5/2020 | Gans | |
| 2020/0192791 A1 | 6/2020 | Yang et al. | |
| 2020/0211640 A1 | 7/2020 | Sharon et al. | |
| 2020/0241984 A1 | 7/2020 | Shim et al. | |
| 2020/0264884 A1 | 8/2020 | Jung | |
| 2020/0265876 A1 | 8/2020 | Takefman et al. | |
| 2020/0372940 A1 * | 11/2020 | Park | G11C 16/32 |
| 2020/0372941 A1 * | 11/2020 | Park | G11C 8/18 |

FOREIGN PATENT DOCUMENTS

| | | |
|---|---|---|
| KR | 10-2015-0143943 | 12/2015 |
| KR | 10-2016-0041717 | 4/2016 |
| KR | 10-2018-0006654 | 1/2018 |

OTHER PUBLICATIONS

Office Action by the USPTO for U.S. Appl. No. 16/679,561 dated Oct. 19, 2020.
Notice of Allowance issued by the USPTO for U.S. Appl. No. 16/679,582 dated Jan. 12, 2021.
Office Action issued by the USPTO for U.S. Appl. No. 16/727,282 dated Feb. 8, 2021.
Notice of Allowance issued by the USPTO for U.S. Appl. No. 16/679,582 dated Apr. 7, 2021.
Notice of Allowance issued by the USPTO for U.S. Appl. No. 16/679,561, dated Feb. 23, 2021.
Notice of Allowance issued by the USPTO for U.S. Appl. No. 16/992,465 dated Apr. 16, 2021.
Notice of Allowance issued by the USPTO of U.S. Appl. No. 16/727,282 dated Jul. 26, 2021.

* cited by examiner

MEMORY SYSTEM AND METHOD OF OPERATING THE MEMORY SYSTEM

CROSS-REFERENCE TO RELATED APPLICATION

The present application claims priority under 35 U.S.C. § 119(a) to Korean patent application number 10-2019-0050591, filed on Apr. 30, 2019, which is incorporated herein by reference in its entirety.

BACKGROUND

Field of Invention

The present disclosure relates to relates to an electronic device, and more particularly, to a memory system and a method of operating the memory system.

Description of Related Art

Recently, the paradigm for a computer environment has transitioned to ubiquitous computing, which enables a computer system to be used whenever and wherever. Therefore, use of portable electronic devices such as mobile phones, digital cameras, and notebook computers is rapidly increasing. Such a portable electronic device generally uses a memory system that uses a memory device, that is, a data storage device. The data storage device is used as a main storage device or an auxiliary storage device of the portable electronic device.

Such a data storage device has advantages in that stability and durability are excellent because there is no mechanical driver, access speed of information is very fast, and power consumption is low. A data storage device of a memory system having such advantages may be any of a universal serial bus (USB) memory device, a memory card having various interfaces, a solid state drive (SSD), and the like.

Generally, there are two types of memory devices: a volatile memory device and a nonvolatile memory device.

Writing and reading speeds of a nonvolatile memory device are relatively slow, however, the nonvolatile memory device maintains storage of data even when power supply is shut off. Therefore, a nonvolatile memory device is used to store data to be maintained regardless of power supply. A nonvolatile memory device includes a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. A flash memory may be a NOR type or a NAND type.

SUMMARY

An embodiment of the present disclosure provides a memory system and a method of operating the memory system capable of efficiently controlling an interface circuit for data communication between a memory controller and a semiconductor memory.

A memory system according to an embodiment of the present disclosure includes a memory device including an interface circuit and a semiconductor memory, and a controller configured to generate a command set in response to a host command and output the command set to the memory device. The interface circuit is configured to: receive the command set, transmit the received command set to the semiconductor memory, when the received command set corresponds to the semiconductor memory perform a blocking operation so that the received command set is not transmitted to the semiconductor memory, when the received command set corresponds to the interface circuit, and perform an on-die termination operation, a ZQ calibration operation, or a driving force control operation of the interface circuit in response to the received command set corresponding to the interface circuit.

A memory system according to an embodiment of the present disclosure includes a controller configured to receive a host command from a host, and generate and output a command set in response to the received host command, an interface circuit configured to receive the command set from the controller, parse the command set, perform a blocking operation on the command set, perform an initial setting internal operation corresponding to the command set or control a timing of the command set and output the command set according to a result of the parsing, and a memory device configured to perform an operation in response to the command set received through the interface circuit.

A method of operating a memory system including a controller, a semiconductor memory, according to an embodiment of the present disclosure includes transmitting, by the controller, a command set to an interface circuit configured to mediate data communication between the controller and the semiconductor memory, determining, by the interface circuit, whether the command set corresponds to the interface circuit or the semiconductor memory, performing, by the interface circuit, an initial setting internal operation on the interface circuit corresponding to the command set after blocking transmission of the command set to the semiconductor memory when it is determined that the command set corresponds to the interface circuit, and controlling, by the interface circuit, a timing of the command set and transmitting, by the interface circuit, the command set to the semiconductor memory when it is determined that the command set corresponds to the semiconductor memory.

An interface circuit according to an embodiment of the present disclosure includes: transfer circuitry electrically coupled to the controller and the memory device and configured to transfer the signal therebetween; and adjustment circuitry configured to: block transfer of the signal in response to an adjustment command from the controller; and perform one or more operations of ZQ calibration, on-die termination and driving strength adjustment to the transfer circuitry in response to the adjustment command.

The present technology may efficiently control the interface circuit by blocking the command received from the memory controller from being transmitted to the semiconductor memory in order to control the operation of the interface circuit included in the memory system and performing the internal operation of the interface circuit in response to the received command.

DETAILED DESCRIPTION

Figure 1:
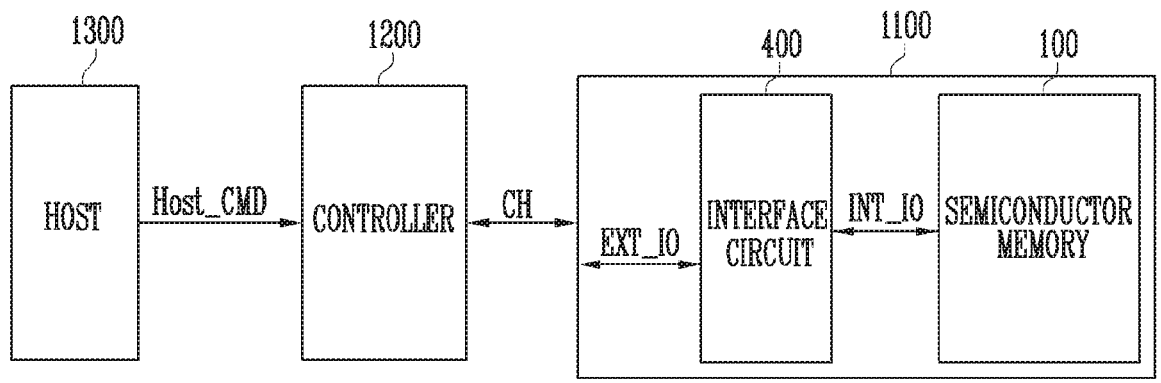
FIG. 1 is a block diagram illustrating a memory system according to an embodiment of the present disclosure.

Specific structural and functional description provided herein is directed to embodiments of the present disclosure. The present invention, however, may be implemented in other forms and/or in different ways. Thus, the present invention is not limited to the embodiments described herein.

Moreover, while the disclosed embodiments are described in detail, the present invention is not limited to any specific details. Rather, the present invention includes all changes, equivalents, or substitutes that do not depart from the spirit and technical scope of the present disclosure.

While terms such as "first" and/or "second" may be used to identify various elements, such elements are not limited by any such term. The above terms may be used to distinguish one element from another element that otherwise have the same or similar names. A first element in one instance may be termed a second element in another instance, or vice versa, without indicating any change in form or functionality of such element.

It will be understood that when an element is referred to as being "connected" or "coupled" to another element, it may be directly connected or coupled to the other element or one or more intervening elements may also be present. In contrast, when an element is referred to as being "directly connected" or "directly coupled" to another element, no intervening element is present. Other expressions describing relationships between elements such as "~between," "immediately ~between" or "adjacent to ~" and "directly adjacent to ~" may be construed similarly.

The terms used in this specification are merely used to describe specific embodiments, and are not intended to limit the present disclosure. Singular forms are intended to include the plural forms as well, unless the context clearly indicates otherwise. In this specification, it should be understood that an open ended term, e.g., "include" or "have," indicates that a feature, a number, a step, an operation, an element, a part or a combination thereof described in this specification is present, but does not exclude a possibility of presence or addition of one or more other features, numbers, steps, operations, elements, parts, or combinations thereof.

So far as not being differently defined, all terms used herein including technical or scientific terminologies have meanings that are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

In describing embodiments, description of well-known technical material that is not directly related to the present disclosure may be omitted. This intends to focus on features and aspects of the present disclosure more clearly by omitting unnecessary description.

Embodiments of the present disclosure are described in detail with reference to the accompanying drawings, so that those skilled in the art may easily practice the present disclosure. Throughout the specification, reference to "an embodiment," "another embodiment" or the like is not necessarily to only one embodiment, and different references to any such phrase are not necessarily to the same embodiment(s).

FIG. 1 is a block diagram illustrating a memory system according to an embodiment of the present disclosure.

Referring to FIG. 1, a memory system 1000 includes a memory device 1100 in which data is stored, a controller 1200 that controls the memory device 1100 under control of a host 1300.

The host 1300 may communicate with the controller by using an interface protocol, such as a peripheral component interconnect-express (PCI-E), an advanced technology attachment (ATA), a serial ATA (SATA), a parallel ATA (PATA), or a serial attached SCSI (SAS). In addition, the interface protocol between the host 1300 and the controller 1200 is not limited to the above-described example, and may be one of other interface protocols such as a universal serial bus (USB), a multi-media card (MMC), an enhanced small disk interface (ESDI), and/or integrated drive electronics (IDE).

The controller 1200 may generally control an operation of the memory system 1000 and control a data exchange between the host 1300 and the memory device 1100. For example, the controller 1200 may control the memory device 1100 according to a request of the host 1300 to program or read data.

In addition, the controller 1200 may control to perform an initial setting internal operation of an interface circuit 400 included in the memory device 1100 according to the request of the host 1300. The initial setting internal operation may be performed after a power on operation of the memory system 1000. The initial setting internal operation may include an on-die termination operation, a ZQ calibration operation, a driving force control operation of an input/output driver included in the interface circuit 400, or the like.

The controller 1200 may generate a command set for controlling the memory device 1100 and transmit the command set to the memory device 1100 in response to a host command Host_CMD corresponding to the request of the host 1300. When the controller 1200 generates the command set for controlling the semiconductor memory 100 in the memory device 1100 according to the request of the host 1300, the controller 1200 generates the command set so that an address corresponding to the semiconductor memory 100 is included in the command set. In addition, when the controller 1200 generates the command set for controlling the interface circuit 400 in the memory device 1100 according to the request of the host 1300, the controller 1200 generates the command set so that an address corresponding to the interface circuit 400 is included in the command set.

According to an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), or a flash memory.

The memory device 1100 may be connected to the controller 1200 through a channel CH and may include the semiconductor memory 100 and the interface circuit 400. The semiconductor memory 100 may communicate with the controller 1200 through the interface circuit 400. For example, the interface circuit 400 may mediate command and data communication between the controller 1200 and the semiconductor memory 100. In addition, the interface circuit 400 may perform retiming on data and a command set exchanged between the controller 1200 and the semiconductor memory 100. The retiming may include buffering for storing and outputting the data or the command set to be transmitted. When the data or the command set to be transmitted is retimed, an output timing of the data or the command set to be transmitted is rearranged, and skew is reduced. That is, the interface circuit 400 may improve reliability of the memory system 1000 by adjusting the output timing the data and the command set exchanged between the controller 1200 and the semiconductor memory 100. The interface circuit 400 may be connected to the channel CH through an external input/output line EXT_IO and may be connected to the semiconductor memory 100 through an internal input/output line INT_IO.

In addition, the interface circuit 400 may perform an on-die termination (ODT) operation in response to a specific command set received from the controller 1200. Since impedance of a semiconductor circuit changes according to process, voltage, and temperature (PVT) change, the semiconductor circuit may improve reliability of transmission operation by matching impedances between the controller 1200 and the interface circuit 400 and between the interface circuit 400 and the semiconductor memory 100 by performing the on-die termination operation. The interface circuit 400 performs the on-die termination operation in response to the specific command set received from the controller 1200 to match the impedance with the semiconductor memory 100 and match the impedance with the controller 1200. During the initial setting internal operation including the on-die termination operation performed in response to the specific command set, the interface circuit 400 blocks transmission of the specific command set to the semiconductor memory 100 in order to prevent the specific command set from being transmitted to the semiconductor memory 100 and causing the semiconductor memory 100 to malfunction.

Figure 2:
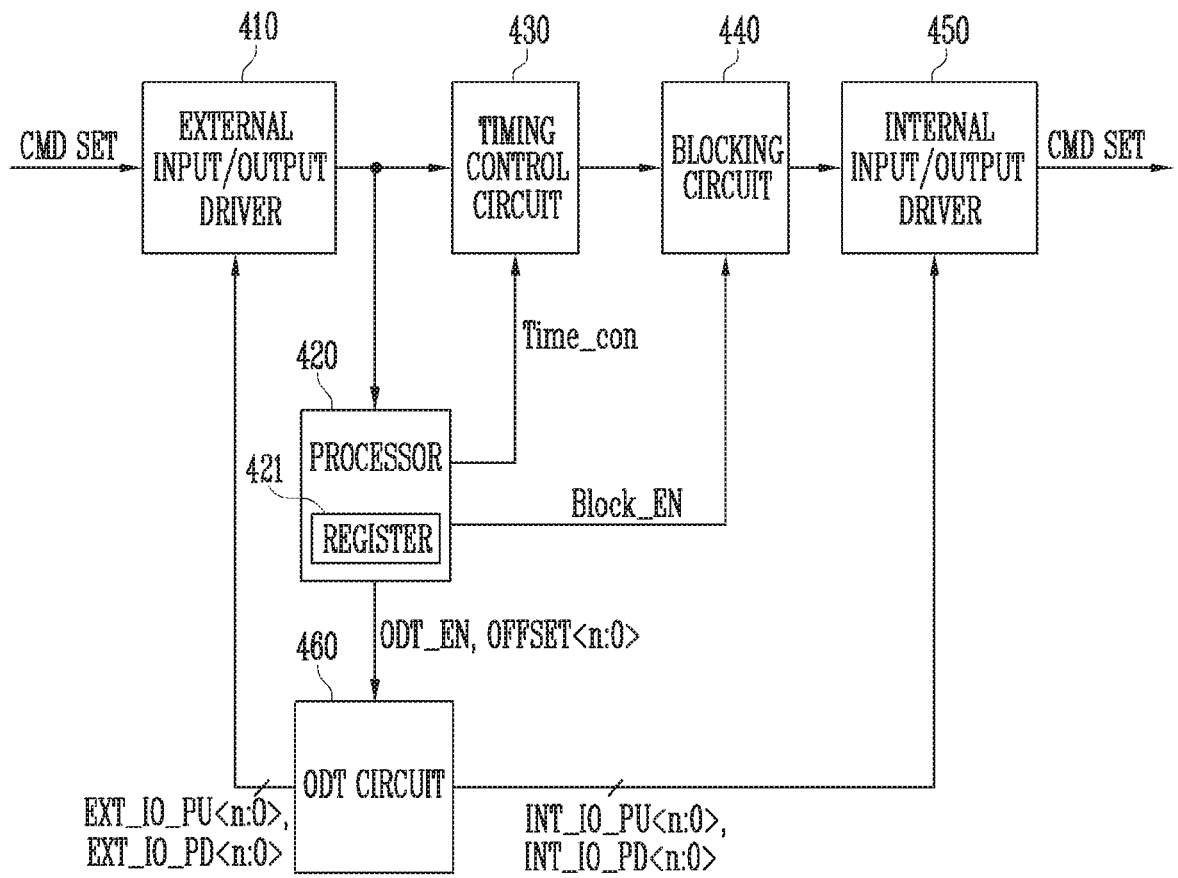
FIG. 2 is a block diagram illustrating a configuration of an interface circuit, such as that of FIG. 1.

FIG. 2 is a block diagram illustrating a configuration of the interface circuit of FIG. 1.

Referring to FIG. 2, the interface circuit 400 may include an external input/output driver 410, a processor 420, a timing control circuit 430, a blocking circuit 440, an internal input/output driver 450, and an ODT circuit 460.

The external input/output driver 410 receives the command set CMD SET from the controller 1200 of FIG. 1 and transmits the command set CMD SET to the processor 420 and the timing control circuit 430. The external input/output driver 410 may control an impedance of an input/output line connected to the external input/output driver 410 in response to an external input/output pull-up code signal EXT_IO_PU<n:0> and an external input/output pull-down code signal EXT_IO_PD<n:0> output from the ODT circuit 460. In addition, the external input/output driver 410 may control a driving force (or a drive strength) thereof in response to the external input/output pull-up code signal EXT_IO_PU<n:0> and the external input/output pull-down code signal EXT_IO_PD<n:0> output from the ODT circuit 460.

The processor 420 receives the command set CMD SET from the external input/output driver 410 and parses the received command set CMD SET. As a result of parsing, when the received command set CMD SET is determined to be transmitted to the semiconductor memory 100 in correspondence with an operation of the semiconductor memory 100 of FIG. 1, the processor 420 generates and outputs a timing control signal Time_con corresponding to the command set CMD SET. In addition, as a result of parsing, when the received command set CMD SET is determined as corresponding to an operation of the interface circuit 400, such as the ODT operation of the interface circuit 400, the ZQ calibration operation, the driving force control operation of the input/output driver, the processor 420 generates and outputs a blocking enable signal Block_EN, an ODT enable signal ODT_EN, and an offset signal OFFSET<n:0>.

The processor 420 may include a register 421, and the register 421 may store a plurality of addresses. The plurality of addresses include an address corresponding to the semiconductor memory 100 and an address corresponding to the interface circuit 400. The processor 420 may compare the address in the command set CMD SET with the address stored in the register 421 during the parsing operation to determine whether the received command set CMD SET corresponds to the semiconductor memory 100 or the interface circuit 400.

The timing control circuit 430 receives the command set CMD SET from the external input/output driver 410, controls and rearranges a timing of the received command set CMD SET in response to the timing control signal Time_con received from the processor 420, and outputs the rearranged command set CMD SET.

The blocking circuit 440 receives the command set CMD SET output from the timing control circuit 430 and transmits the command set CMD SET to the internal input/output driver 450. When the blocking circuit 440 receives the blocking enable signal Block_EN from the processor 420, the blocking circuit 440 blocks a transmission operation so that the command set CMD SET received from the timing control circuit 430 is not transmitted to the internal input/output driver 450.

The internal input/output driver 450 receives the command set CMD SET through the blocking circuit 440 and transmits the command set CMD SET to the semiconductor memory 100 of FIG. 1. The internal input/output driver 450 may control an impedance of an input/output line connected to the internal input/output driver 450 in response to an internal input/output pull-up code signal INT_IO_PU<n:0> and an internal input/output pull-down code signal INT_IO_PD<n:0> output from the ODT circuit 460. In addition, the internal input/output driver 450 may control the driving force thereof in response to the internal input/output pull-up code signal and the internal input/output pull-down code signal output from the ODT circuit 460.

The ODT circuit 460 performs the ZQ calibration operation of generating information on the PVT change in response to the ODT enable signal ODT_EN received from the processor 420, and the on-die termination operation of controlling the impedance of the input/output line according to the information generated as a result of the ZQ calibration operation. For example, the ODT circuit 460 performs the ZQ calibration operation in response to the ODT enable signal ODT_EN, generates and outputs the external input/output pull-up code signal EXT_IO_PU<n:0> and the external input/output pull-down code signal EXT_IO_PD<n:0> for controlling the impedance of the input/output line connected to the external input/output driver 410, and generates and outputs the internal input/output pull-up code signal and the internal input/output pull-down code signal for controlling the impedance of the input/output line connected to the internal input/output driver 450, according to a result of the ZQ calibration operation. In addition, the ODT circuit 460 may control the driving force of the external input/output driver 410 by controlling code values of the external input/output pull-up code signal EXT_IO_PU<n:0> and the external input/output pull-down code signal EXT_IO_PD<n:0> in response to the offset signal OFFSET<n:0>. In addition, the ODT circuit 460 may control the driving force of the internal input/output driver 450 by controlling code values of the internal input/output pull-up code signal INT_IO_PU<n:0> and the internal input/output pull-down code signal INT_IO_PD<n:0> in response to the offset signal OFFSET<n; 0>.

Figure 3:
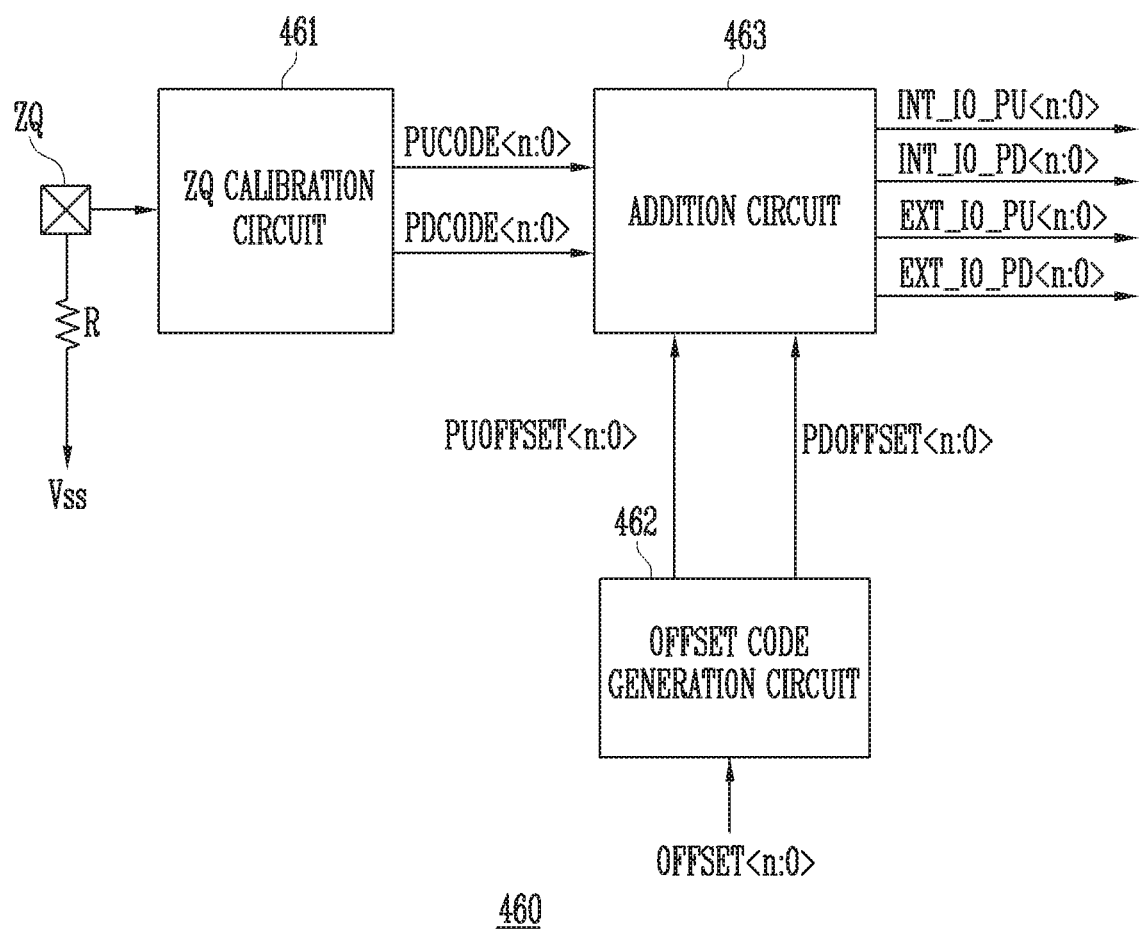
FIG. 3 is a block diagram illustrating a configuration of an ODT circuit, such as that of FIG. 2.

FIG. 3 is a block diagram illustrating a configuration of the ODT circuit of FIG. 2.

Referring to FIG. 3, the ODT circuit 460 may include a ZQ calibration circuit 461, an offset code generation circuit 462, and an addition circuit 463.

The ZQ calibration circuit 461 generates a pull-up code PUCODE<n:0> and a pull-down code PDCODE<n:0>. The ZQ calibration circuit 461 compares a voltage received through a ZQ pad ZQ connected to an external resistor R with a reference voltage, and generates the pull-up code PUCODE<n:0> and the pull-down code PDCODE<n:0> according to a comparison result. The ZQ calibration circuit 461 may change and generate the pull-up code PUCODE<n:0> and the pull-down code PDCODE<n:0> according to the change of the process, voltage, and temperature. That is, the ZQ calibration circuit 461 may generate the pull-up code PUCODE<n; 0> and the pull-down code PDCODE<n:0> that change according to a PVT characteristic change.

The offset code generation circuit 462 generates a pull-up offset code PUOFFSET<n:0> and a pull-down offset code PDOFFSET<n:0> in response to the offset signal OFFSET<n:0>. The offset signal OFFSET<n:0> may be changed according to the driving force of the external input/output driver 410 and the internal input/output driver 450 of FIG. 2, which are to be controlled.

The addition circuit 463 adds the pull-up code PUCODE<n; 0> with the pull-up offset code PUOFFSET<n:0> to generate the internal input/output pull-up code signal INT_IO_PU<n:0> and the external input/output pull-up code signal EXT_IO_PU<n:0>, and adds pull-down code PDCODE<n:0> with the pull-down offset code PDOFFSET<n:0> to generate and output the internal input/output pull-down code signal and the external input/output pull-down code signal.

Figure 4:
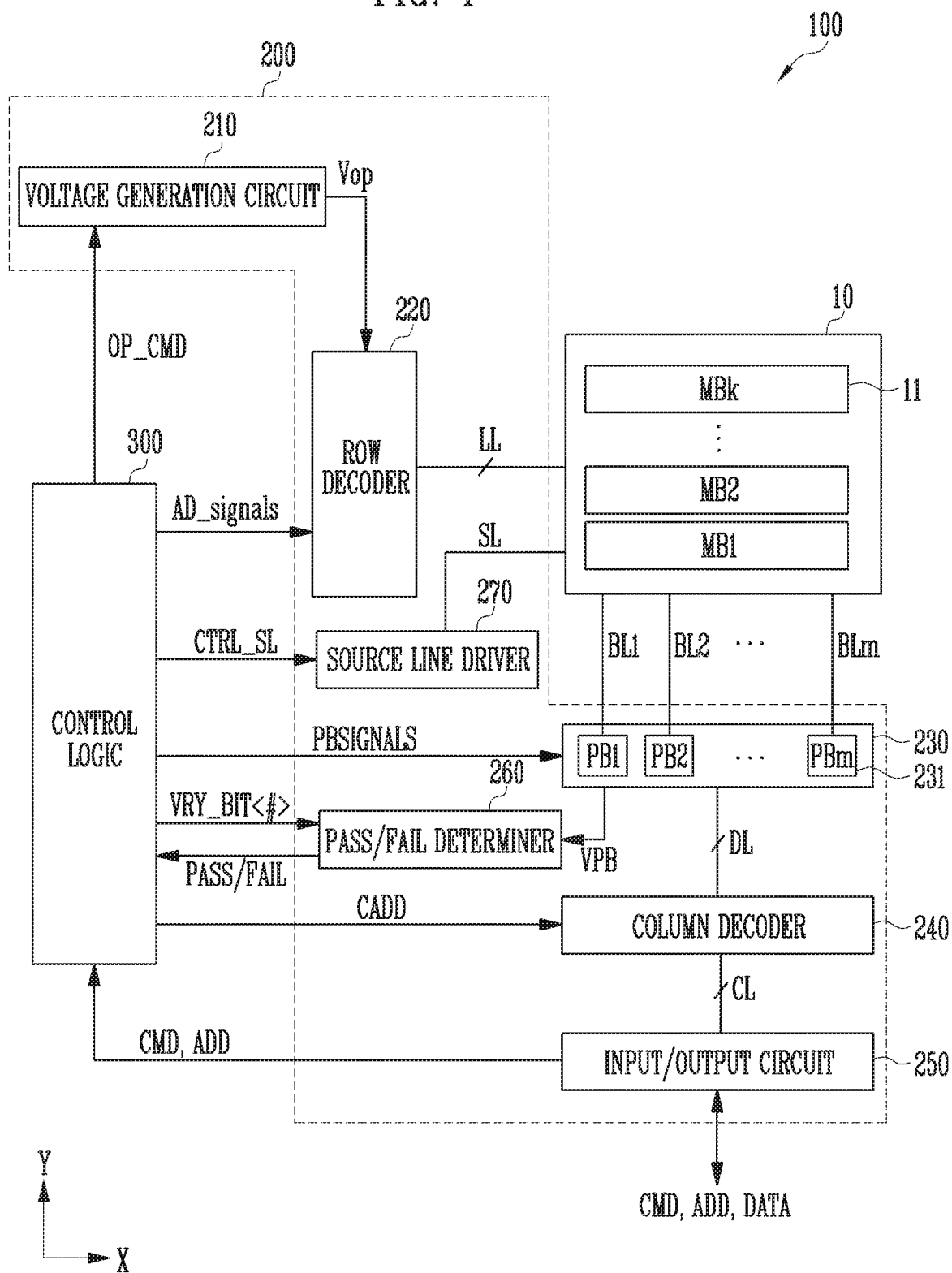
FIG. 4 is a diagram illustrating a semiconductor memory, such as that of FIG. 1.

FIG. 4 is a diagram illustrating the semiconductor memory 100 of FIG. 1.

Referring to FIG. 4, the semiconductor memory 100 may include a memory cell array 10 in which data is stored. The semiconductor memory 100 may include a peripheral circuit 200 configured to perform a program operation for storing data in the memory cell array 10, a read operation for outputting the stored data, and an erase operation for erasing the stored data. The semiconductor memory 100 may include a control logic 300 that controls the peripheral circuit 200 according to the command set that is generated in the controller 1200 of FIG. 1 and received through the interface circuit 400 of FIG. 1. The command set may include a command CMD, an address ADD, and data DATA.

The memory cell array 10 may include a plurality of, e.g., k, memory blocks MB1 to MBk 11 (k is a positive integer greater than 1). Local lines LL and bit lines BL1 to BLm (m is a positive integer greater than 1) may be connected to each of the memory blocks MB1 to MBk. For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. The local lines LL may be connected to the memory blocks MB1 to MBk 11, respectively, and the bit lines BL1 to BLm may be commonly connected to the memory blocks MB1 to MBk 11. The memory blocks MB1 to MBk 11 may be implemented in a two-dimensional (2D) or three-dimensional (3D) structure. Implemented in a 2D structure, the memory cells may be arranged in a direction parallel to a substrate in the memory block 11. Implemented in a 3D structure, the memory cells may be stacked in a direction perpendicular to the substrate in the memory block 11.

The peripheral circuit 200 may be configured to perform the program, read, and erase operations of the memory block 11 selected under control of the control logic 300. For example, the peripheral circuit 200 may include a voltage generation circuit 210, a row decoder 220, a page buffer group 230, a column decoder 240, an input/output circuit 250, a pass/fail determiner (pass/fail check circuit) 260, and a source line driver 270.

The voltage generation circuit 210 may generate various operation voltages Vop used in the program, read, and erase operations in response to an operation signal OP_CMD. In addition, the voltage generation circuit 210 may selectively discharge the local lines LL in response to the operation signal OP_CMD. For example, the voltage generation circuit 210 may generate a program voltage, a verify voltage, a pass voltage, and a select transistor operation voltage under the control of the control logic 300.

The row decoder 220 may transmit the operation voltages Vop to the local lines LL connected to the selected memory block 11 in response to a row decoder control signals AD_signals1 and AD_signals2. For example, the row decoder 220 may selectively apply the operation voltages (for example, the program voltage, the verify voltage, the pass voltage, and the like) generated in the voltage generation circuit 210 in response to the row decoder control signals AD_signals to the word lines among the local lines LL.

The row decoder 220 applies the program voltage generated in the voltage generation circuit 210 to the selected word line among the local lines LL and applies the pass voltage generated in the voltage generation circuit 210 to the remaining unselected word lines, in response to the row decoder control signals AD_signals during a program voltage application operation. In addition, the row decoder 220 applies the read voltage generated in the voltage generation circuit 210 to the selected word line among the local lines LL and applies the pass voltage generated in the voltage generation circuit 210 to the remaining unselected word lines, in response to the row decoder control signals AD_signals during a read operation.

The page buffer group 230 may include a plurality of page buffers PB1 to PBm and 231 connected to the bit lines BL1 to BLm. The page buffers PB1 to PBm and 231 may operate in response to page buffer control signals PBSIGNALS. For example, the page buffers PB1 to PBm and 231 may temporarily store data to be programmed during a program operation or sense a voltage or a current of the bit lines BL1 to BLm during the read operation or the verify operation.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer the internal command CMD and the address ADD received from the controller 1200 of FIG. 1 to the control logic 300 or may exchange the data DATA with the column decoder 240.

The pass/fail determiner 260 may generate a reference current in response to a permission bit VRY_BIT<#> during the read operation or the verify operation, compare a sensing voltage VPB received from the page buffer group 230 with a reference voltage generated by the reference current, and output a pass signal PASS or a fail signal FAIL.

The source line driver 270 may be connected to the memory cell in the memory cell array 10 through a source line SL and may control a voltage applied to the source line SL. The source line driver 270 may receive a source line control signal CTRL_SL from the control logic 300 and may control a source line voltage applied to the source line SL based on the source line control signal CTRL_SL.

The control logic 300 may output the operation signal OP_CMD, the row decoder control signal AD_signals, the page buffer control signals PBSIGNALS, and the permission bit VRY_BIT<#> in response to the command CMD and the address ADD to control the peripheral circuit 200. In addition, the control logic 300 may determine whether the verify operation is passed or failed in response to the pass signal PASS or the fail signal FAIL.

Figure 5:
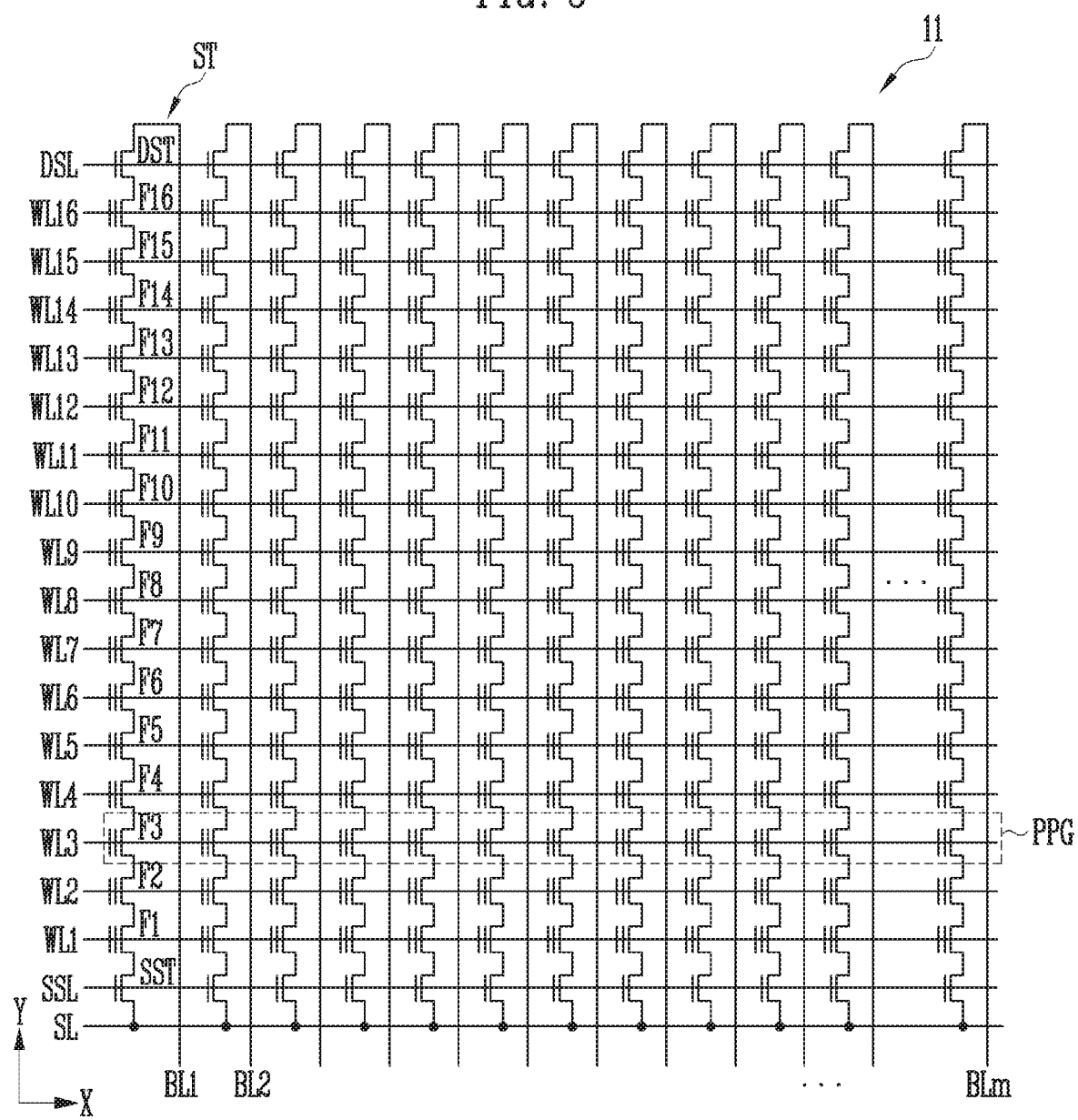
FIG. 5 is a diagram illustrating a memory block, such as that of FIG. 4.

FIG. 5 is a diagram illustrating a representative memory block of FIG. 4.

Referring to FIG. 5, the memory block 11 may be connected to the plurality of word lines arranged in parallel with each other between the first select line and the second select line. Here, the first select line may be a source select line SSL, and the second select line may be a drain select line DSL. More specifically, the memory block 11 may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured to be identical to each other, a string ST connected to the first bit line BL1 will be described in detail, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include more than 16 memory cells.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST in the different strings ST may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells in different strings ST may be referred to as a physical page PPG. Therefore, the memory block 11 may include the same number of physical pages PPG as word lines WL1 to WL16, e.g., 16 physical pages PPG in this example.

One memory cell may store one bit of data. This is commonly referred to as a single level cell (SLC). In this case, one physical page PPG may store one logical page (LPG) data. One logical page (LPG) data may include the same number of data bits as the number of cells in one physical page PPG. In addition, one memory cell may store two or more bits of data. This is commonly referred to as a multi-level cell (MLC). In this case, one physical page PPG may store two or more logical page (LPG) data.

Figure 6:
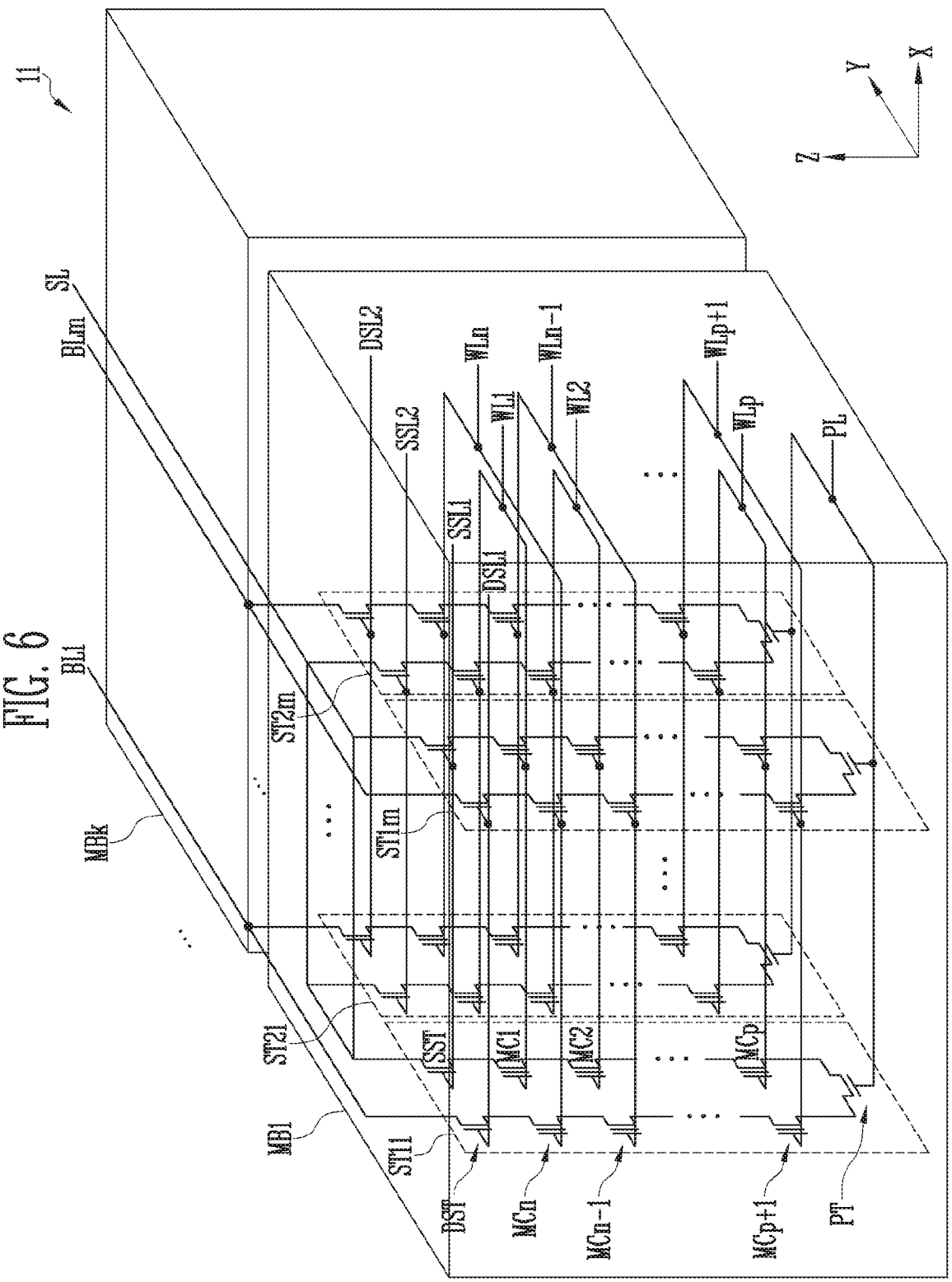
FIG. 6 is a diagram illustrating an embodiment of a three-dimensional (3D) memory block.

FIG. 6 is a diagram illustrating an embodiment of a 3D-configured memory block.

Referring to FIG. 6, the memory cell array 10 may include a plurality of, e.g., k, memory blocks MB1 to MBk. The memory block 11 may include a plurality of strings ST11 to ST1*m* and ST21 to ST2*m*. As an embodiment, each of the plurality of strings ST11 to ST1*m* and ST21 to ST2*m* may be formed in a U shape. In the first memory block MB1, m strings may be arranged in a row direction (X direction). In FIG. 5, two strings are arranged in a column direction (Y direction), but this is for clarity; three or more strings may be arranged in the column direction (Y direction).

Each of the plurality of strings ST11 to ST1*m* and ST21 to ST2*m* may include at least one source select transistor SST, first to n-th memory cells MC1 to MCn, a pipe transistor PT, and at least one drain select transistor DST.

The source and drain select transistors SST and DST and the memory cells MC1 to MCn may have similar structures. For example, each of the source and drain select transistors SST and DST and the memory cells MC1 to MCn may include a channel film, a tunnel insulating film, a charge trap film, and a blocking insulating film. For example, a pillar for proving the channel film may be provided in each string. For example, a pillar for providing at least one of the channel film, the tunnel insulating film, the charge trap film, and the blocking insulating film may be provided in each string.

The source select transistor SST of each string may be connected between the source line SL and the memory cells MC1 to MCp.

In an embodiment, the source select transistors of the strings arranged in the same row may be connected to the source select line extending in the row direction, and the source select transistors of the strings arranged in different rows may be connected to different source select lines. In FIG. 6, the source select transistors of the strings ST11 to ST1*m* of a first row may be connected to a first source select line SSL1. The source select transistors of the strings ST21 to ST2m of a second row may be connected to a second source select line SSL2.

In another embodiment, the source select transistors of the strings ST11 to ST1m and ST21 to ST2m may be commonly connected to one source select line.

The first to n-th memory cells MC1 to MCn of each string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a vertical direction (Z direction), and may be connected in series between the source select transistor SST and the pipe transistor PT. The (p+1)-th to n-th memory cells MCp+1 to MCn may be sequentially arranged in the vertical direction (Z direction), and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each string may be connected to the first to n-th word lines WL1 to WLn, respectively.

In an embodiment, at least one of the first to n-th memory cells MC1 to MCn may be used as a dummy memory cell. When the dummy memory cell is provided, a voltage or a current of a corresponding string may be stably controlled. A gate of the pipe transistor PT of each string may be connected to a pipeline PL.

The drain select transistor DST of each string may be connected between the bit line and the memory cells MCp+1 to MCn. The strings arranged in the row direction may be connected to the drain select line extending in the row direction. The drain select transistors of the strings ST11 to ST1m of the first row may be connected to a first drain select line DSL1. The drain select transistors of the strings ST21 to ST2m of the second row may be connected to a second drain select line DSL2.

The strings arranged in the column direction may be connected to the bit lines extending in the column direction. In FIG. 5, the strings ST11 and ST21 of a first column may be connected to the first bit line BL1. The strings ST1m and ST2m of an m-th column may be connected to the m-th bit line BLm.

Among the strings arranged in the row direction, the memory cells connected to the same word line may configure one page. For example, the memory cells connected to the first word line WL1 of the strings ST11 to ST1m of the first row may configure one page. The memory cells connected to the first word line WL1 of the strings ST21 to ST2m of the second row may configure another page. One of the drain select lines DSL1 and DSL2 is selected and thus the strings arranged in one row direction are selected. One of the word lines WL1 to WLn is selected and thus one page is selected among the selected strings.

Figure 7:
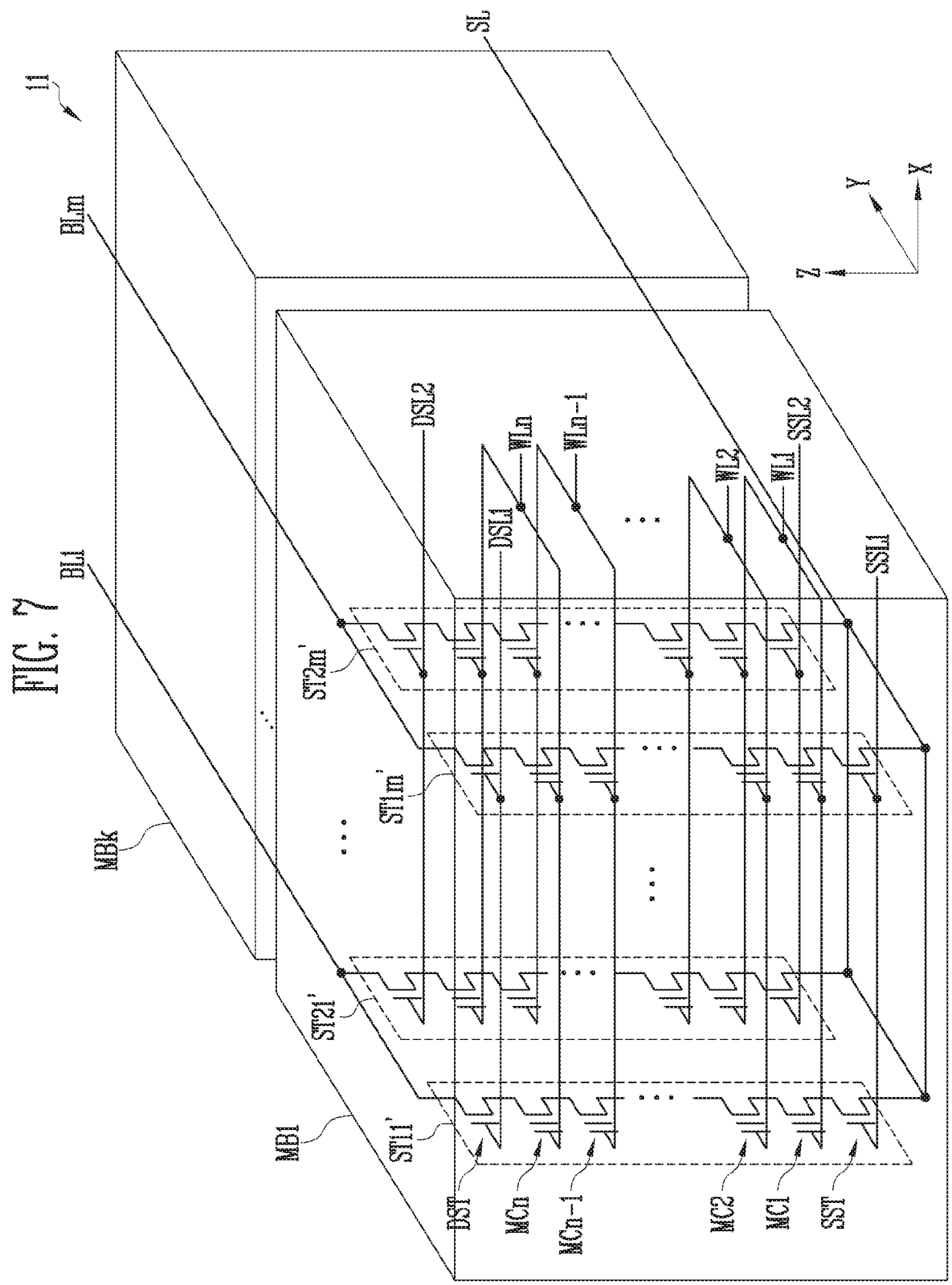
FIG. 7 is a diagram illustrating another embodiment of a 3D memory block.

FIG. 7 is a diagram illustrating another embodiment of a 3D configured memory block.

Referring to FIG. 7, the memory cell array 10 may include a plurality of memory blocks MB1 to MBk. The memory block 11 may include a plurality of strings ST11' to ST1m' and ST21' to ST2m'. Each of the plurality of strings ST11' to ST1m' and ST21' to ST2m' may extend along the vertical direction (Z direction). In the memory block 11, m strings may be arranged in the row direction (X direction). In FIG. 7, two strings are arranged in the column direction (Y direction), but this is for clarity; three or more strings may be arranged in the column direction (Y direction).

Each of the plurality of strings ST11' to ST1m' and ST21' to ST2m' may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11' to ST1m' arranged in the first row may be connected to the first source select line SSL1. The source select transistors of the strings ST21' to ST2m' arranged in the second row may be connected to the second source select line SSL2. In another embodiment, the source select transistors of the strings ST11' to ST1m' and ST21' to ST2m' may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

In an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory block 11 may be improved.

The drain select transistor DST of each string may be connected between the bit line and the memory cells MC1 to MCn. The drain select transistors DST of the strings arranged in the row direction may be connected to the drain select line extending in the row direction. The drain select transistors DST of the strings ST11' to ST1m' of the first row may be connected to the first drain select line DSL1. The drain select transistors DST of the strings ST21' to ST2m' of the second row may be connected to the second drain select line DSL2.

Figure 8:
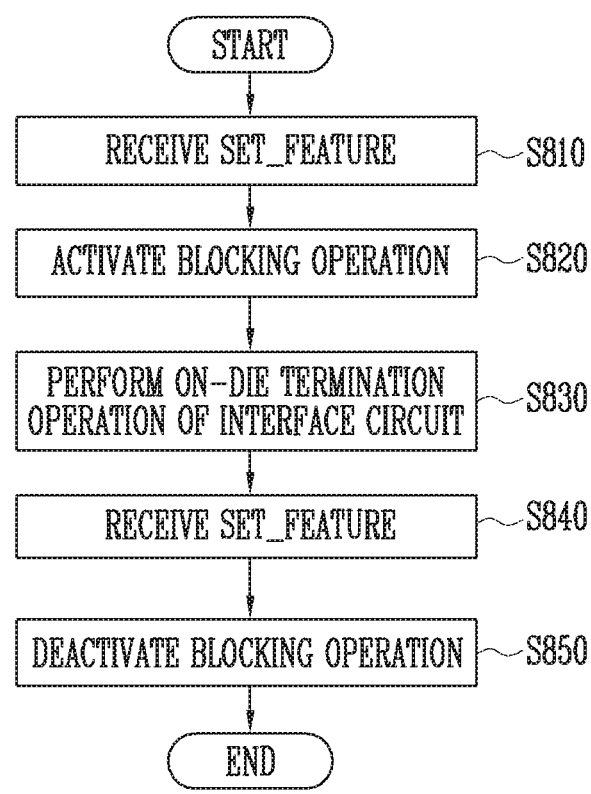
FIG. 8 is a flowchart illustrating a method of operating a memory system according to a first embodiment of the present disclosure.

FIG. 8 is a flowchart illustrating a method of operating a memory system according to an embodiment of the present disclosure.

Figure 9:
FIG. 9 is a diagram illustrating a command configuration according to an embodiment of the present disclosure.

FIG. 9 is a diagram illustrating a configuration of the command set.

Such method of operating a memory system is described with reference to FIGS. 1 to 9 as follows.

In an embodiment of the present disclosure, the on-die termination operation of the interface circuit 400 in the memory device 1100 is performed in response to the request from the host 1300.

The host 1300 outputs a specific command SET_FEATURE for the internal setting operation of the memory device 1100 as a host command Host_CMD.

The controller 1200 receives the specific command SET_FEATURE from the host 1300 (S810), generates a command set corresponding to the received specific command SET_FEATURE, and outputs the generated command set to the memory device 1100.

The command set may include the command CMD corresponding to the on-die termination operation, the address ADD corresponding to the interface circuit 400, and the data DATA corresponding to a detailed set value of the on-die termination operation, as shown in FIG. 9. For example, the address ADD in the command set corresponding to the internal operation of the semiconductor memory 100 corresponds to the semiconductor memory 100, and the address ADD in the command set corresponding to the internal operation of the interface circuit 400, such as the on-die termination operation, the ZQ calibration operation, or the driving force control operation of the input/output driver corresponds to the interface circuit 400.

The interface circuit 400 of the memory device 1100 receives the command set from the controller 1200 and performs the operation of blocking the command set from being transmitted to the semiconductor memory 100 in response to the received command set (S820).

More specifically, the processor 420 of the interface circuit 400 parses the command set CMD SET received through the external input/output driver 410, and when the parsing indicates that the address ADD in the command set CMD SET corresponds to the interface circuit 400, the processor 420 generates and outputs the blocking enable signal Block_EN. The blocking circuit 440 is activated in response to the blocking enable signal Block_EN to perform the blocking operation of blocking the transmission of the command set CMD SET from the timing control circuit 430 to the internal input/output driver 450. Therefore, transmission of the command set CMD SET to the semiconductor memory 100 during the on-die termination operation of the interface circuit 400 may be prevented.

The processor 420 generates and outputs the ODT enable signal ODT_EN and the offset signal OFFSET<n; 0> according to a result of the parsing of the command set CMD SET. The ODT circuit 460 performs the on-die termination operation of controlling the impedance of the input/output line in response to the ODT enable signal ODT_EN received from the processor 420 (S830). During the on-die termination operation, the ZQ calibration operation may be performed to generate the information on the PVT change, and the impedance of the input/output line may be controlled according to the generated information. In addition, the ODT circuit 460 may control the driving force of the external input/output driver 410 and the internal input/output driver 450 in response to the offset signal OFFSET<n; 0> during the on-die termination operation.

Thereafter, the host 1300 outputs the specific command SET_FEATURE for ending the internal setting operation of the memory device 1100 as the host command Host_CMD.

The controller 1200 receives the specific command SET_FEATURE from the host 1300 (S840), generates the command set corresponding to the received specific command SET_FEATURE, and outputs the generated command set to the memory device 1100.

The interface circuit 400 of the memory device 1100 receives the command set from the controller 1200 and deactivates the blocking operation in response to the received command set (S850).

As described above, according to an embodiment of the present disclosure, when the command set corresponding to the on-die termination operation of the interface circuit 400 is received by the interface circuit 400, the interface circuit 400 performs the on-die termination operation in response to the command set after blocking the transmission of the command set to the semiconductor memory 100. Therefore, malfunctioning of the semiconductor memory 100 may be prevented.

Figure 10:
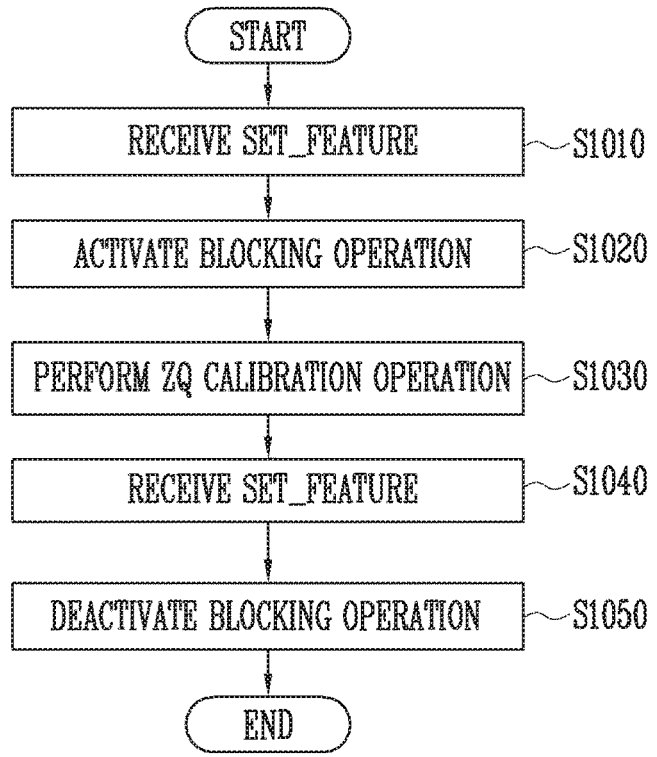
FIG. 10 is a flowchart illustrating a method of operating a memory system according to a second embodiment of the present disclosure.

FIG. 10 is a flowchart illustrating a method of operating a memory system according to another embodiment of the present disclosure.

Such method of operating a memory system is described with reference to FIGS. 1 to 7, 9, and 10 as follows.

In another embodiment of the present disclosure, the ZQ calibration operation of the interface circuit 400 in the memory device 1100 is performed in response to the request from the host 1300.

The host 1300 outputs the specific command SET_FEATURE for the internal setting operation of the memory device 1100 as the host command Host_CMD.

The controller 1200 receives the specific command SET_FEATURE from the host 1300 (S1010), generates the command set corresponding to the received specific command SET_FEATURE, and outputs the generated command set to the memory device 1100.

The command set may include the command CMD corresponding to the ZQ calibration operation, the address ADD corresponding to the interface circuit 400, and the data DATA corresponding to a detailed set value of the ZQ calibration operation, as shown in FIG. 9. For example, the address ADD in the command set corresponding to the internal operation of the semiconductor memory 100 corresponds to the semiconductor memory 100, and the address ADD in the command set corresponding to the internal operation of the interface circuit 400, such as the on-die termination operation, the ZQ calibration operation, or the driving force control operation of the input/output driver corresponds to the interface circuit 400.

The interface circuit 400 of the memory device 1100 receives the command set from the controller 1200 and performs the blocking operation of blocking the command set from being transmitted to the semiconductor memory 100 in response to the received command set (S1020).

More specifically, the processor 420 of the interface circuit 400 parses the command set CMD SET received through the external input/output driver 410, and when the parsing indicates that the address ADD in the command set CMD SET corresponds to the interface circuit 400, the processor 420 generates and outputs the blocking enable signal Block_EN. The blocking circuit 440 is activated in response to the blocking enable signal Block_EN to block the transmission of the command set CMD SET from the timing control circuit 430 to the internal input/output driver 450. Therefore, the transmission of the command set CMD SET to the semiconductor memory 100 during the ZQ calibration operation of the interface circuit 400 may be prevented.

The processor 420 generates and outputs the ODT enable signal ODT_EN according to a result of the parsing of the command set CMD SET. The ZQ calibration circuit 461 of the ODT circuit 460 performs the ZQ calibration operation to generate the pull-up code PUCODE<n:0> and the pull-down code PDCODE<n:0> changed according to the PVT characteristic (S1030). In an embodiment of the present disclosure, reliability of the data transmission operation may be improved by controlling a pull-up operation and a pull-down operation of the external input/output driver 410 and the internal input/output driver 450 based on the pull-up code PUCODE<n:0> and the pull-down code PDCODE<n:0> generated as a result of the ZQ calibration operation.

Thereafter, the host 1300 outputs the specific command SET_FEATURE for ending the internal setting operation of the memory device 1100 as the host command Host_CMD.

The controller 1200 receives the specific command SET_FEATURE from the host 1300 (S1040), generates the command set corresponding to the received specific command SET_FEATURE, and outputs the generated command set to the memory device 1100.

The interface circuit 400 of the memory device 1100 receives the command set from the controller 1200 and deactivates the blocking operation in response to the received command set (S1050).

As described above, according to an embodiment of the present disclosure, when the command set corresponding to the ZQ calibration operation of the interface circuit 400 is received by the interface circuit 400, the interface circuit 400 performs the ZQ calibration operation in response to the command set after blocking the transmission of the command set to the semiconductor memory 100. Therefore, malfunctioning of the semiconductor memory 100 may be prevented.

Figure 11:
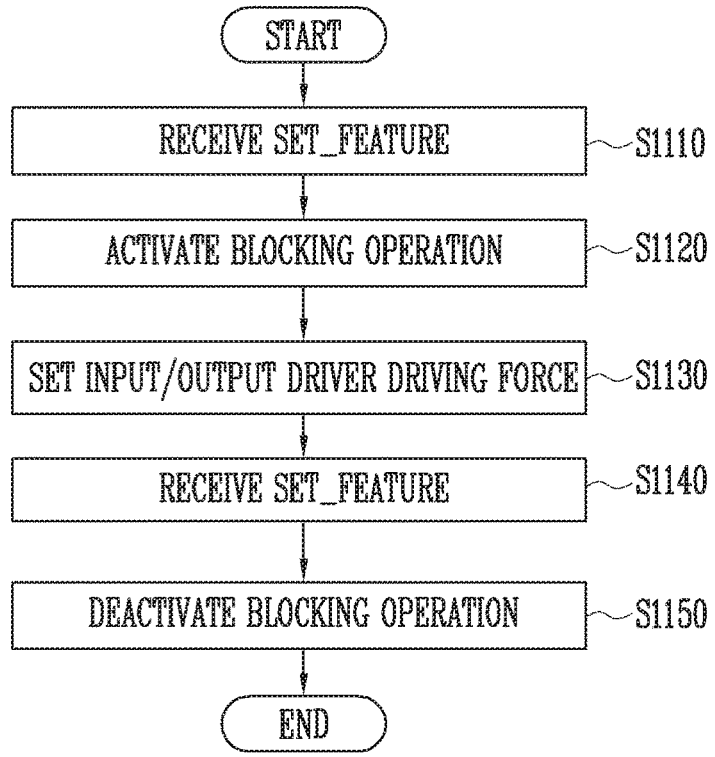
FIG. 11 is a flowchart illustrating a method of operating a memory system according to a third embodiment of the present disclosure.

FIG. 11 is a flowchart illustrating a method of operating a memory system according to another embodiment of the present disclosure.

Such method of operating a memory system is described with reference to FIGS. 1 to 7, 9, and 11 as follows.

In another embodiment of the present disclosure, the driving force control operation of the interface circuit 400 in the memory device 1100 is performed in response to the request from the host 1300.

The host 1300 outputs the specific command SET_FEATURE for the internal setting operation of the memory device 1100 as the host command Host_CMD.

The controller 1200 receives the specific command SET_FEATURE from the host 1300 (S1010), generates the command set corresponding to the received specific command SET_FEATURE, and outputs the generated command set to the memory device 1100.

The command set may include the command CMD corresponding to the driving force control operation, the address ADD corresponding to the interface circuit 400, and the data DATA corresponding to a detailed set value of the driving force control operation, as shown in FIG. 9. For example, the address ADD in the command set corresponding to the internal operation of the semiconductor memory 100 corresponds to the semiconductor memory 100, and the address ADD in the command set corresponding to the internal operation of the interface circuit 400, such as the on-die termination operation, the ZQ calibration operation, or the driving force control operation of the input/output driver corresponds to the interface circuit 400.

The interface circuit 400 of the memory device 1100 receives the command set from the controller 1200 and performs the operation of blocking the command set from being transmitted to the semiconductor memory 100 in response to the received command set (S1120).

More specifically, the processor 420 of the interface circuit 400 parses the command set CMD SET received through the external input/output driver 410, and when the parsing indicates that the address ADD in the command set CMD SET corresponds to the interface circuit 400, the processor 420 generates and outputs the blocking enable signal Block_EN. The blocking circuit 440 is activated in response to the blocking enable signal Block_EN to block the transmission of the command set CMD SET from the timing control circuit 430 to the internal input/output driver 450. Therefore, transmission of the command set CMD SET to the semiconductor memory 100 during the driving force control operation of the input/output driver of the interface circuit 400 may be prevented.

The processor 420 generates and outputs the ODT enable signal ODT_EN and the offset signal OFFSET<n:0> according to a result of the parsing of the command set CMD SET. The offset signal OFFSET<n:0> is generated based on the data DATA in the command set CMD SET.

The offset code generation circuit 462 of the ODT circuit 460 outputs the pull-up offset code PUOFFSET<n:0> and the pull-down offset code PDOFFSET<n:0> in response to the offset signal OFFSET<n:0>. The addition circuit 463 generates the internal input/output pull-up code signal INT_IO_PU<n:0>, the internal input/output pull-down code signal INT_IO_PD<n:0>, the external input/output pull-up code signal EXT_IO_PU<n:0>, and the external input/output pull-down code signal EXT_IO_PD<n:0> in response to the pull-up offset code PUOFFSET<n:0> and the pull-down offset code PDOFFSET<n:0>, and sets the driving force of the input/output driver (S1130). For example, the driving force of the external input/output driver 410 during a data input/output operation is controlled in response to the external input/output pull-up code signal EXT_IO_PU<n:0> and the external input/output pull-down code signal EXT_IO_PD<n:0>, and the driving force of the internal input/output driver 450 during the data input/output operation is controlled in response to the internal input/output pull-up code signal INT_IO_PU<n:0> and the internal input/output pull-down code signal INT_IO_PD<n:0>.

Thereafter, the host 1300 outputs the specific command SET_FEATURE for ending the internal setting operation of the memory device 1100 as the host command Host_CMD.

The controller 1200 receives the specific command SET_FEATURE from the host 1300 (S1140), generates the command set corresponding to the received specific command SET_FEATURE, and outputs the generated command set to the memory device 1100.

The interface circuit 400 of the memory device 1100 receives the command set from the controller 1200 and deactivates the blocking operation in response to the received command set (S1150).

As described above, according to an embodiment of the present disclosure, when the command set corresponding to the driving force control operation of the input/output driver of the interface circuit 400 is received by the interface circuit 400, the interface circuit 400 performs the driving force control operation of the input/output driver in response to the command set after blocking the transmission of the command set to the semiconductor memory 100. Therefore, malfunctioning of the semiconductor memory 100 may be prevented.

Figure 12:
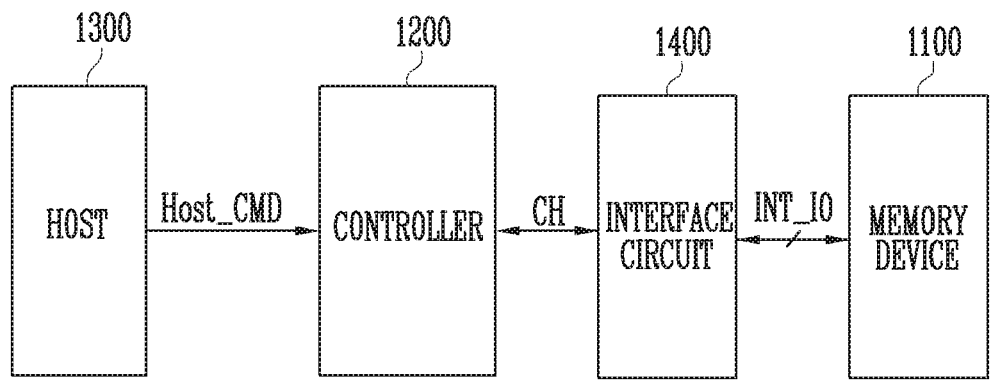
FIG. 12 is a diagram illustrating another embodiment of the memory system.

FIG. 12 is a diagram illustrating another embodiment of the memory system.

Referring to FIG. 12, a memory system 1000 includes a memory device 1100 in which data is stored, a controller 1200 that controls the memory device 1100 under control of a host 1300, and an interface circuit 1400 that mediates command and data transmission between the controller 1200 and the memory device 1100.

Differently from the memory system 1000 shown in FIG. 1, in the memory system 1000 shown in FIG. 12, the interface circuit 1400 may be disposed outside the memory device 1100 and may transmit the command and data through the memory device 1100 and an internal input/output line INT_IO.

The controller 1200 may generally control an operation of the memory system 1000 and control a data exchange between the host 1300 and the memory device 1100. The controller 1200 may control a plurality of semiconductor memories included in the memory device 1100 to program or read data according to a request of the host 1300. In addition, the controller 1200 may control to perform the on-die termination operation, the ZQ calibration operation, and the driving force control operation of the input/output driver of the interface circuit 1400 in response to the request of the host 1300. The controller 1200 may generate the command set for controlling the memory device 1100 or the interface circuit 1400 and transmit the command set to the memory device 1100 in response to the host command Host_CMD corresponding to the request of the host 1300. The command set for controlling the memory device 1100 includes an address corresponding to at least one of a plurality of semiconductor memories in the memory device 1100 and the command set for controlling the interface circuit 1400 includes an address corresponding to the interface circuit 1400.

The interface circuit 1400 may be configured and operated as illustrated in FIGS. 2 and 3 and described above. That is, the interface circuit 1400 may perform the on-die termination operation, the ZQ calibration operation, and the driving force setting operation of the input/output driver in response to the specific command set received from the controller 1200, and the specific command set is not transmitted to the memory device 1100 by the blocking operation.

Figure 13:
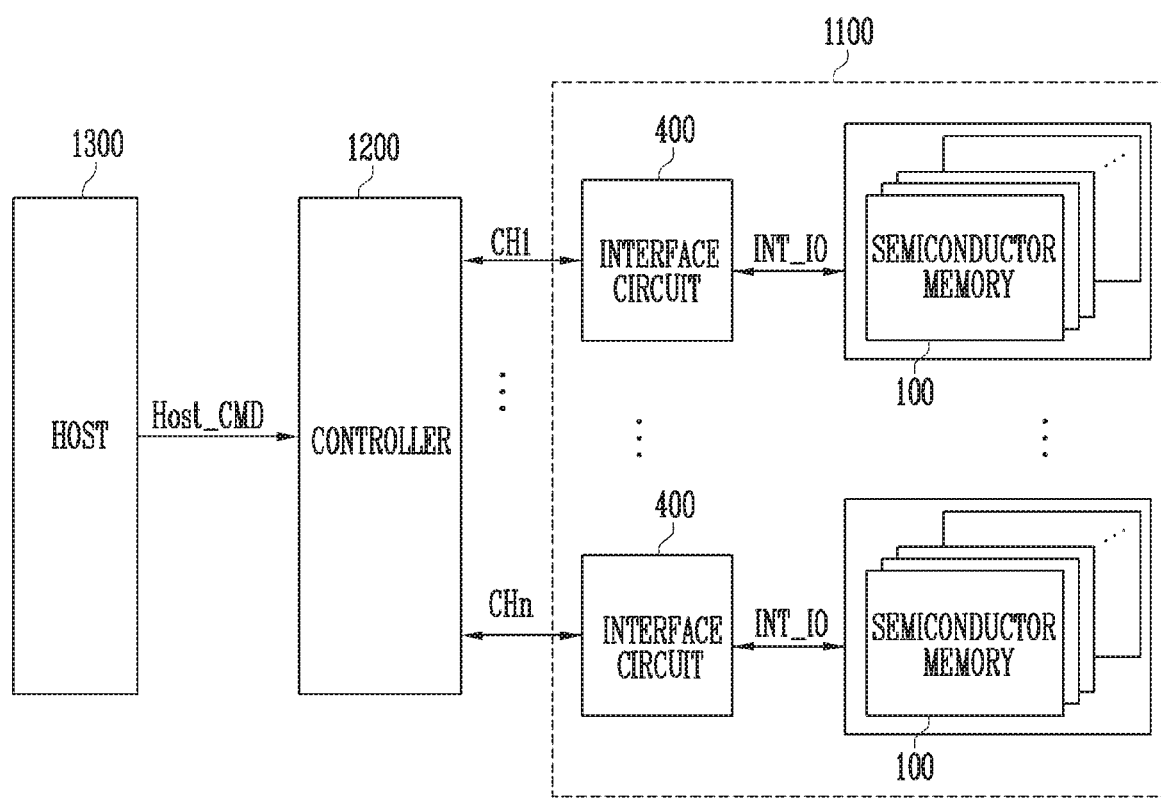
FIG. 13 is a diagram illustrating another embodiment of the memory system.

FIG. 13 is a diagram illustrating another embodiment of the memory system.

Referring to FIG. 13, a memory system 1000 includes a memory device 1100 and a controller 1200. The memory device 1100 includes a plurality of semiconductor memories 100 and a plurality of interface circuits 400. The plurality of semiconductor memories 100 may be divided into a plurality of groups, and each of the plurality of groups may be connected to one interface circuit 400 through an internal input/output line INT_IO.

In FIG. 13, a plurality of interface circuits 400 communicate with the controller 1200 through first to n-th channels CH1 to CHn, respectively. Therefore, the semiconductor memories 100 in one group are configured to communicate with the controller 1200 through one interface circuit 400 and a common channel. The controller 1200 is configured to control the plurality of semiconductor memories 100 of the memory device 1100 through the plurality of channels CH1 to CHn.

The controller 1200 may generally control an operation of the memory system 1000 and control a data exchange between the host 1300 and the memory device 1100. The controller 1200 may control the plurality of semiconductor memories 100 in the memory device 1100 to program or read data according to a request of the host 1300. In addition, the controller 1200 may control to perform the on-die termination operation, the ZQ calibration operation, and the driving force control operation of the input/output driver of the interface circuits 400 in response to the request of the host 1300. The controller 1200 may generate the command set for controlling the memory device 1100 or the interface circuits 400 and transmit the command set to the memory device 1100 in response to the host command Host_CMD corresponding to the request of the host 1300. The command set for controlling the memory device 1100 includes an address corresponding to at least one of the plurality of semiconductor memories 100 in the memory device 1100 and the command set for controlling the interface circuit 400 includes an address corresponding to the interface circuit 400.

The interface circuit 400 may be configured and operated as illustrated in FIGS. 2 and 3 and described above. That is, the interface circuit 400 may perform the on-die termination operation, the ZQ calibration operation, and the driving force setting operation of the input/output driver in response to the specific command set received from the controller 1200, and the specific command set is not transmitted to the memory device 1100 by the blocking operation.

The controller 1200 and the memory device 1100 may be integrated into one semiconductor device. In an embodiment, the controller 1200 and the memory device 1100 may be integrated into one semiconductor device to form a memory card, such as a PC card (personal computer memory card international association (PCMCIA)), a compact flash card (CF), a smart media card (SM, SMC), a memory stick, a multimedia card (MMC, RS-MMC, MMCmicro), an SD card (SD, miniSD, microSD, SDHC), and/or a universal flash memory (UFS).

The controller 1200 and the memory device 1100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), operation speed of the host 1300 connected to the memory system 1000 is dramatically improved.

As another example, the memory system 1000 is provided as of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring telematics network, an RFID device, or one of various components configuring a computing system.

In an embodiment, the memory device 1100 or memory system 1000 may be mounted as a package of any of various types. For example, the memory device 1100 or the memory system 1000 may be packaged and mounted as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), or a wafer-level fabricated package processed stack package (WSP).

Figure 14:
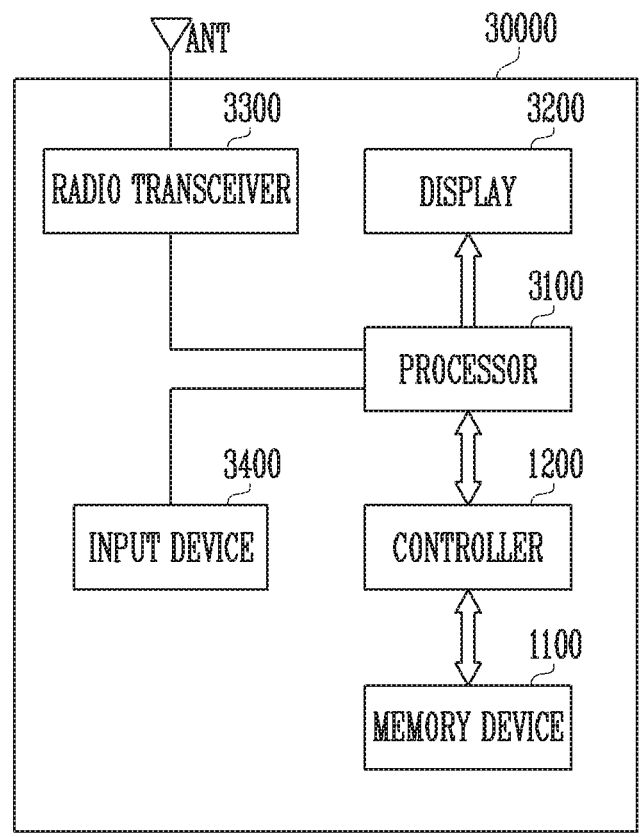
FIG. 14 is a diagram illustrating another embodiment of the memory system.

FIG. 14 is a diagram illustrating another embodiment of the memory system.

Referring to FIG. 14, a memory system 30000 may be implemented as a cellular phone, a smartphone, a tablet PC, a personal digital assistant (PDA) or a wireless communication device. The memory system 30000 may include the memory device 1100 and the controller 1200 capable of controlling the operation of the memory device 1100. The controller 1200 may control a data access operation, for example, a program operation, an erase operation, or a read operation, of the memory device 1100 under control of a processor 3100.

Data programmed in the memory device 1100 may be output through a display 3200 under the control of the controller 1200.

A radio transceiver 3300 may transmit and receive radio signals through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the controller 1200 or the display 3200. The controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the controller 1200, data output from the radio transceiver 3300, or data output from the input device 3400 is output through the display 3200.

According to an embodiment, the controller 1200 capable of controlling the operation of memory device 1100 may be implemented as a part of the processor 3100 or may be implemented as a chip separate from the processor 3100. In addition, the memory device 1100 may include the interface circuit 400, such as the memory device 1100 shown in FIG. 1 or the memory device 1100 shown in FIG. 13. In addition, when the memory device 1100 includes only a semiconductor memory as shown in FIG. 12, an interface circuit for data communication between the controller 1200 and the memory device 1100 may be additionally provided. The interface circuit may be configured as the interface circuit 400 of FIG. 2.

Figure 15:
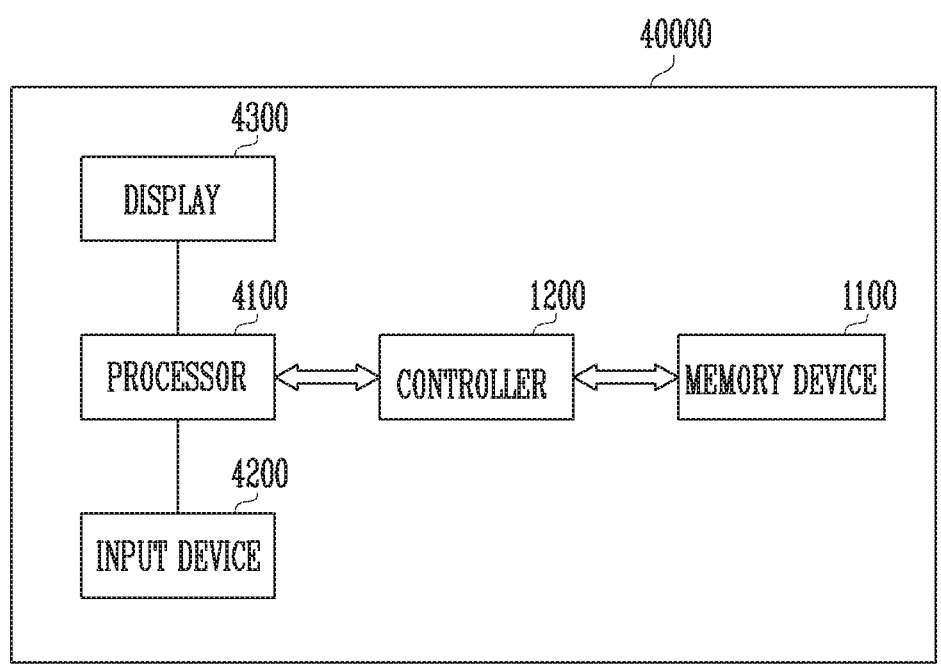
FIG. 15 is a diagram illustrating another embodiment of the memory system.

FIG. 15 is a diagram illustrating another example of the memory system.

Referring to FIG. 15, a memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the controller 1200 capable of controlling a data process operation of the storage device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the controller 1200. According to an embodiment, the controller 1200 capable of controlling the operation of memory device 1100 may be implemented as a part of the processor 4100 or may be implemented as a chip separate from the processor 4100. In addition, the memory device 1100 may include the interface circuit 400, such as the memory device 1100 shown in FIG. 1 or the memory device 1100 shown in FIG. 13. In addition, when the memory device 1100 includes only a semiconductor memory as shown in FIG. 12, an interface circuit for data communication between the controller 1200 and the memory device 1100 may be additionally provided. The interface circuit may be configured as the interface circuit 400 of FIG. 2.

Figure 16:
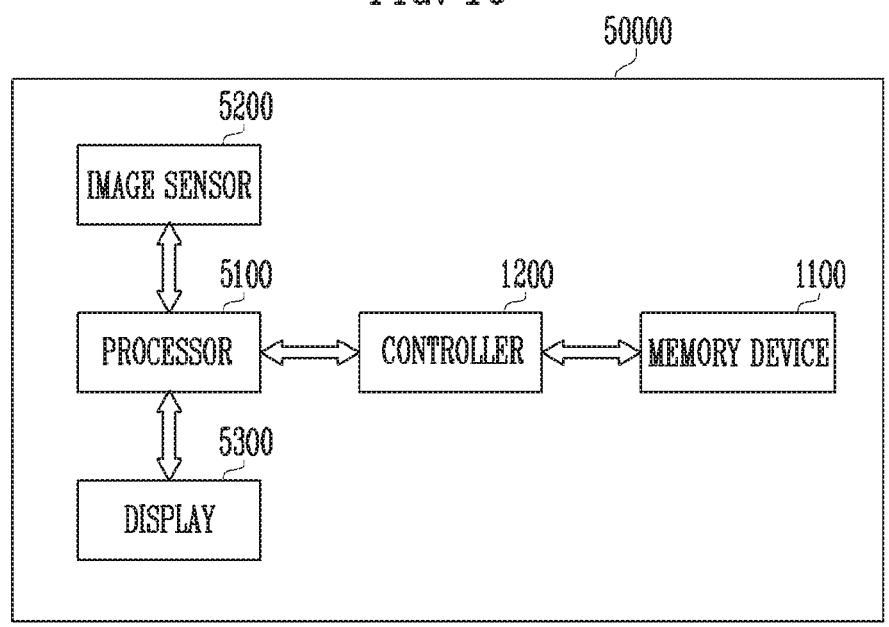
FIG. 16 is a diagram illustrating another embodiment of the memory system.

FIG. 16 is a diagram illustrating another embodiment of the memory system.

Referring to FIG. 16, a memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the controller 1200. Under the control of the processor 5100, the converted digital signals may be output through a display 5300 or stored in the memory device 1100 through the controller 1200. Data stored in the memory device 1100 may be output through the display 5300 under the control of the processor 5100 or the controller 1200.

According to an embodiment, the controller 1200 capable of controlling the operation of memory device 1100 may be implemented as a part of the processor 5100 or may be implemented as a chip separate from the processor 5100. In addition, the memory device 1100 may include the interface circuit 400, such as the memory device 1100 shown in FIG. 1 or the memory device 1100 shown in FIG. 13. In addition, when the memory device 1100 includes only a semiconductor memory as shown in FIG. 12, an interface circuit for data communication between the controller 1200 and the memory device 1100 may be additionally provided. The interface circuit may be configured as the interface circuit 400 of FIG. 2.

Figure 17:
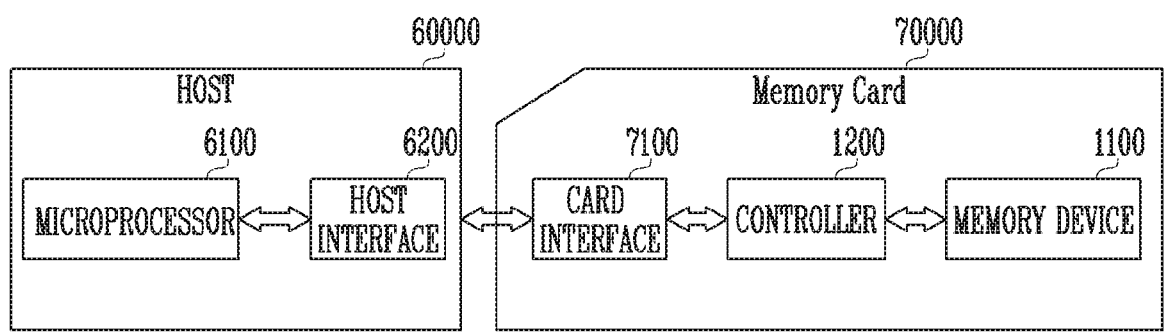
FIG. 17 is a diagram illustrating another embodiment of the memory system.

FIG. 17 is a diagram illustrating another embodiment of the memory system.

Referring to FIG. 17, a memory system 70000 may be implemented as a memory card or a smart card. The memory system 70000 may include the memory device 1100, the controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but is not limited thereto. In addition, the memory device 1100 may include the interface circuit 400, such as the memory device 1100 shown in FIG. 1 or the memory device 1100 shown in FIG. 13. In addition, when the memory device 1100 includes only a semiconductor memory as shown in FIG. 12, an interface circuit for data communication between the controller 1200 and the memory device 1100 may be additionally provided. The interface circuit may be configured as the interface circuit 400 of FIG. 2.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the controller 1200 under control of a microprocessor 6100.

Although the present disclosure describes specific embodiments, various changes and modifications may be made without departing from the scope and technical spirit of the present disclosure. The present invention is thus not limited to or by the disclosed embodiments. Rather, the present invention encompasses all such changes and modifications to the extent they fall within the claims and their equivalents.

In the embodiments described above, some steps, depending on context, may optionally be performed or omitted. Also, certain steps may be performed in a different order. Moreover, the disclosed embodiments provide specific examples for the purpose of easily understanding the technical content of this application, and are not intended to limit the scope of this invention. That is, those skilled in the art to which the present disclosure pertains will understand that various modifications based on the technical spirit of the present disclosure are possible.

In describing embodiments, although specific terms are used, they are not intended to limit the scope of the present disclosure. The present invention is defined by the claims and their equivalents.

What is claimed is:

1. A memory system comprising:
   a memory device including an interface circuit and a semiconductor memory; and
   a controller configured to generate a command set in response to a host command and output the command set to the memory device;
   wherein the interface circuit is configured to:
   receive the command set,
   control a timing of transmitting the received command set to the semiconductor memory in response to a timing control signal,
   transmit the received command set to the semiconductor memory, when the received command set corresponds to the semiconductor memory,
   perform a blocking operation in response to a blocking enable signal so that the received command set is not transmitted from the interface circuit to the semiconductor memory, when the received command set corresponds to the interface circuit, and
   perform an on-die termination operation, a ZQ calibration operation, or a driving force control operation of the interface circuit in response to the received command set corresponding to the interface circuit.

2. The memory system according to claim 1, wherein the interface circuit performs retiming on the received command set.

3. The memory system according to claim 1,
   wherein, when an address in the command set corresponds to the semiconductor memory, the interface circuit transmits the received command set to the semiconductor memory, and
   wherein, when the address corresponds to the interface circuit, the interface circuit performs the blocking operation.

4. The memory system according to claim 1, wherein interface circuit comprises:
   an external input/output driver configured to receive the command set from the controller;
   a processor configured to parse the command set, generate the timing control signal when the command set corresponds to the semiconductor memory, and generate the blocking enable signal and an internal operation control signal when the command set corresponds to the interface circuit;
   a timing control circuit configured to control the timing of the command set received through the external input/output driver in response to the timing control signal, and output the command set;
   a blocking circuit configured to transfer the command set from the timing control circuit while performing the blocking operation of the command set received through the timing control circuit in response to the blocking enable signal;
   an internal input/output driver configured to transmit the command set transferred through the blocking circuit to the semiconductor memory; and
   an on-die termination circuit configured to perform the on-die termination operation on the external input/output driver and the internal input/output driver in response to the internal operation control signal.

5. The memory system according to claim 4, wherein the processor includes a register that stores an address corresponding to the semiconductor memory and an address corresponding to the interface circuit.

6. The memory system according to claim 5, wherein the processor parses the received command set by comparing the address in the received command set with the address included in the register.

7. A memory system comprising:
   a memory device;
   a controller configured to receive a host command from a host, and generate and output a command set in response to the received host command; and
   an interface circuit configured to receive the command set from the controller, to control a timing of transmitting the received command set to the memory device in response to a timing control signal, parse the command set, perform a blocking operation in response to a blocking enable signal so that the command set is not transmitted from the interface circuit, perform an initial setting internal operation corresponding to the command set or control a timing of the command set and output the command set according to a result of the parsing,
   wherein the memory device is configured to perform an operation in response to the command set received through the interface circuit.

8. The memory system according to claim 7, wherein the controller generates the command set for controlling the interface circuit by including an address corresponding to the interface circuit in the command set.

9. The memory system according to claim 7, wherein the controller generates the command set for controlling the memory device by including an address corresponding to the memory device in the command set.

10. The memory system according to claim 7, wherein, when the command set corresponds to the interface circuit as a result of the parsing, the interface circuit performs the blocking operation to prevent the command set from being transmitted to the memory device, and then performs an on-die termination operation, a ZQ calibration operation, or a driving force control operation on an external input/output driver and an internal input/output driver in the interface circuit in response to the received command set corresponding to the interface circuit.

11. The memory system according to claim 7, wherein, when the command set corresponds to the memory device as a result of the parsing, the interface circuit controls the timing of the command set and outputs the command set to the memory device according to the controlled timing.

12. The memory system according to claim 7, wherein the interface circuit determines whether the command set corresponds to the interface circuit or the memory device according to an address included in the received command set.

13. The memory system according to claim 7, wherein the interface circuit comprises:
   an external input/output driver configured to receive the command set from the controller;
   a processor configured to parse the command set, generate the timing control signal when the command set corresponds to the semiconductor memory, and generate the blocking enable signal and an internal operation control signal when the command set corresponds to the interface circuit;
   a timing control circuit configured to control the timing of the command set received through the external input/output driver in response to the timing control signal, and output the command set;
   a blocking circuit configured to transfer the command set from the timing control circuit while performing the blocking operation of the command set received through the timing control circuit in response to the blocking enable signal;
   an internal input/output driver configured to transmit the command set transferred through the blocking circuit to the semiconductor memory; and
   an on-die termination circuit configured to perform an on-die termination operation on the external input/output driver and the internal input/output driver in response to the internal operation control signal.

14. The memory system according to claim 13, wherein the processor includes a register that stores an address corresponding to the semiconductor memory and an address corresponding to the interface circuit.

15. A method of operating a memory system including a controller, a semiconductor memory, the method comprising:
   transmitting, by the controller, a command set to an interface circuit configured to mediate data communication between the controller and the semiconductor memory;
   determining, by the interface circuit, whether the command set corresponds to the interface circuit or the semiconductor memory;
   performing, by the interface circuit, an initial setting internal operation on the interface circuit corresponding to the command set after blocking transmission of the command set to the semiconductor memory when it is determined that the command set corresponds to the interface circuit; and
   controlling, by the interface circuit, a timing of the command set and transmitting, by the interface circuit, the command set to the semiconductor memory when it is determined that the command set corresponds to the semiconductor memory.

16. The method according to claim 15, wherein the interface circuit determines whether the command set corresponds to the interface circuit or the semiconductor memory based on an address in the command set.

17. The method according to claim 15, wherein the initial setting internal operation is an on-die termination operation, a ZQ calibration operation, or an input/output driver driving force control operation.

* * * * *